United States Patent [19]
Kimura et al.

[11] Patent Number: 5,792,258
[45] Date of Patent: Aug. 11, 1998

[54] HIGH-FREQUENCY INDUCTION HEATER AND METHOD OF PRODUCING SEMICONDUCTOR SINGLE CRYSTAL USING THE SAME

[75] Inventors: Masanori Kimura; Ken Yoshizawa, both of Annaka; Teruaki Fukami, Fukushima-ken; Hirotoshi Yamagishi, Annaka, all of Japan

[73] Assignee: Shin-Etsu Handotai Co., Ltd., Tokyo, Japan

[21] Appl. No.: 593,698

[22] Filed: Jan. 29, 1996

[30] Foreign Application Priority Data

Jan. 31, 1995 [JP] Japan .................................. 7-013591
Mar. 2, 1995 [JP] Japan .................................. 7-042732

[51] Int. Cl.$^6$ ............................................. C30B 13/20
[52] U.S. Cl. ........................... 117/222; 117/49; 117/51
[58] Field of Search .......................... 117/222, 49, 51; 219/638, 672

[56] References Cited

U.S. PATENT DOCUMENTS

| | | |
|---|---|---|
| 3,827,017 | 7/1974 | Keller ............................. 117/222 |
| 3,898,413 | 8/1975 | Keller ............................. 219/638 |
| 4,749,837 | 6/1988 | von Ammon et al. . |
| 5,055,647 | 10/1991 | Heyes et al. ................. 219/10.43 |
| 5,266,765 | 11/1993 | Storm et al. ................... 219/129 |
| 5,324,906 | 6/1994 | Dong ............................. 219/626 |

FOREIGN PATENT DOCUMENTS

| | | |
|---|---|---|
| 0 292 920 | 11/1988 | European Pat. Off. . |
| 0490071 | 6/1992 | European Pat. Off. ........ 117/222 |
| 25 38 831 | 3/1977 | Germany . |
| 3226713 | 1/1984 | Germany ......................... 219/638 |

*Primary Examiner*—Robert Kunemund
*Attorney, Agent, or Firm*—Nikaido Marmelstein Murray & Oram LLP

[57] ABSTRACT

A high-frequency induction heater for use in the growth of a semiconductor single crystal by the FZ method, including a plurality of high-frequency induction heating coils disposed in concentric juxtaposed relation to each other and each having a pair of power supply terminals provided for supplying a high-frequency current to the associated heating coil, with the power supply terminals of one of the heating coils being disposed in a space defined between opposite ends of an adjacent heating coil disposed outside the one heating coil, wherein a pair of electrically conductive members is attached to the pair of power supply terminals, respectively, of at least an innermost one of the heating coils so as to cover a space defined between the power supply terminals of the innermost heating coil. With the induction heater thus constructed, the so-called "pulsation", i.e., microscopic resistivity fluctuations and the macroscopic resistivity distribution in the diametrical and growth directions can be improved at one time.

17 Claims, 11 Drawing Sheets

PRIOR ART

PRIOR ART

HIGH-FREQUENCY INDUCTION HEATER AND METHOD OF PRODUCING SEMICONDUCTOR SINGLE CRYSTAL USING THE SAME

BACKGROUND OF THE INVENTION

1. Field of the Invention

The present invention relates generally to a high-frequency induction heater (hereinafter sometimes referred to as "induction heater") for heating a polycrystal rod to melt the same, and more particularly to a high-frequency induction heater used in the growth of a semiconductor single crystal by the FZ (float-zone) method, and a method of producing the semiconductor single crystal using the induction heater.

2. Description of the Related Art

Figure 7:
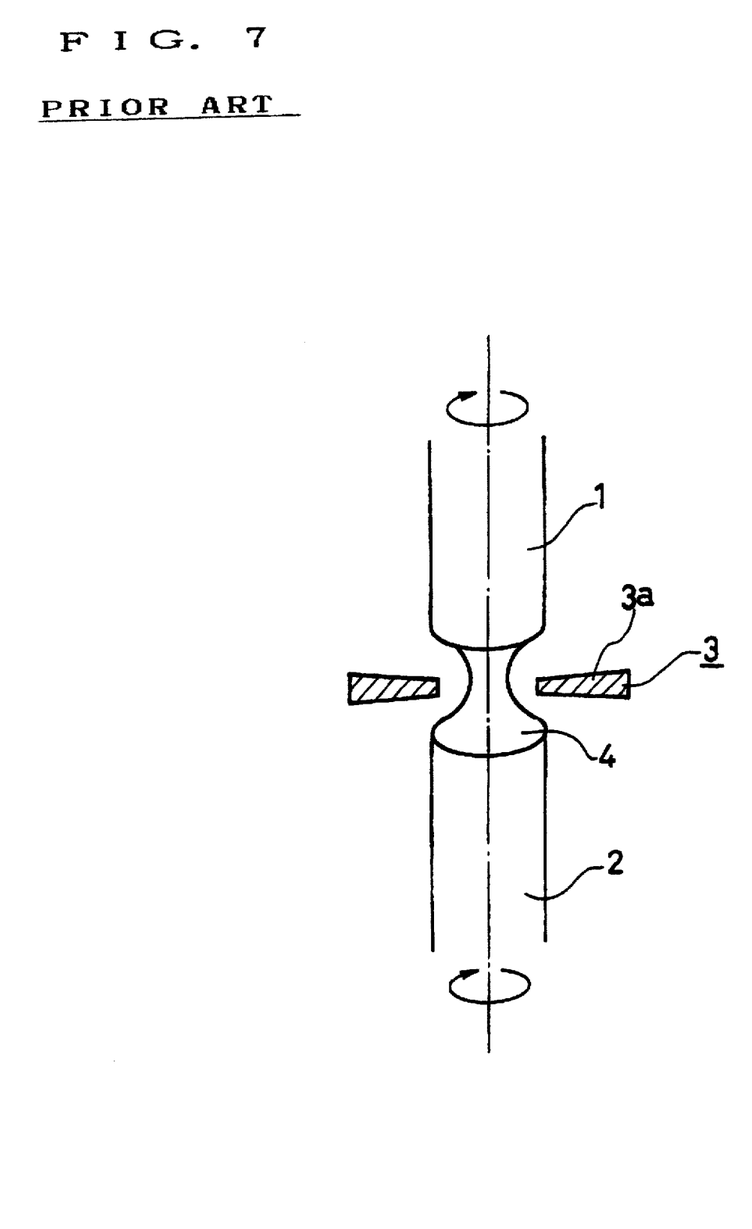
FIG. 7 is a diagrammatical explanatory view showing a conventional method of growing a single crystal by the FZ method.

A process for growing a semiconductor single crystal by the FZ method is known in which as shown in FIG. 7, a polycrystal rod 1 supported by an upper shaft, with a small-diameter single seed crystal supported by a lower shaft disposed beneath the polycrystal rod 1, is heated by a high-frequency induction heater 3 having a high-frequency induction heating coil (hereinafter sometimes simply referred to as "heating coil") 3a disposed around the polycrystal rod 1 to form a molten zone which in turn is contacted and fused with the seed crystal. The seeding process is followed by necking, i.e., the process of forming a thin neck to eliminate dislocations during which time and continuously thereafter the heating coil 3a and the polycrystal rod 1 are relatively rotated while moving them in the axial direction relatively to each other, so that a rod-like dislocation-free single crystal 2 is grown.

This known method requires the polycrystal rod 1 to be melted throughout at its narrow region in a short period of time. On the other hand, to achieve a stable growth of the single crystal 2 without involving irregular impurity distribution, an end of the single crystal which is in contact with a floating zone (melt zone) 4 should gradually send out or radiate heat. To meet these requirements, the heating coil 3a used conventionally is composed, in many cases, of a flat single-turn induction heating coil.

Figure 8:
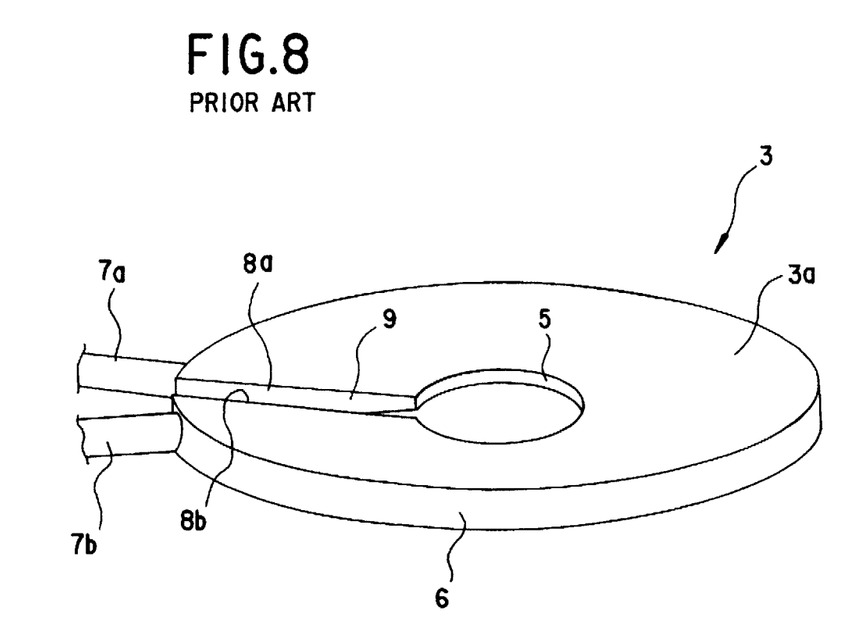
FIG. 8 is a diagrammatical perspective view of a high-frequency induction heater according to a first prior art.

One known induction heater having such flat single-turn induction heating coil is shown in FIG. 8 (such as disclosed in Japanese Patent Publication No. 51-24964 hereinafter referred to as "first prior art"). The induction heater 3 of the first prior art includes an open or split ring-shaped heating coil 3a having a wedge-like cross section tapering toward an inner peripheral surface 5, and a pair of power supply terminals 7a and 7b attached to an outer peripheral surface 6 of the heating coil 3a. The heating coil 3a has, at its opposite ends, two confronting surfaces 8a and 8b lying in close proximity to each other with an air gap 9 defined therebetween. With this construction, the heating coil 3a forms an electric circuit which is symmetrical in the circumferential direction and hence is capable of generating a substantially uniformly distributed magnetic field.

According to the first prior art induction heater 3 shown in FIG. 8, the air gap 9 is defined along surfaces extending perpendicular to the winding direction of the heating coil 3a. It is, therefore, unavoidable that the generated magnetic field becomes irregular at the position of the air gap 9 even if the confronting surfaces 8a and 8b come close to each other to the utmost extent. Furthermore, in the vicinity of the confronting surfaces 8a and 8b, the electric current is caused to flow in the forward and reverse directions along the radial direction. The current flowing in the opposite directions multiplies the intensity of a vertical or axial component of the electromagnetic field which has a significant effect on the crystal growth. Thus, the irregularity in the distribution of the magnetic field is increased.

With the irregularly distributed magnetic field thus generated, if relative movement between the polycrystal rod 1 and the heating coil 3a is taken in both axial and circumferential directions, the resulting single crystal is made to have alternate layers of increased impurity concentration and decreased impurity concentration formed repeatedly (called "pulsation") due to a local temperature difference caused by irregular distribution of the magnetic field in each growth cycle achieved during a single revolution of the polycrystal rod 1 relative to the heating coil 3a. When the single crystal having such pulsation is used for device fabrication, the pulsation would cause microscopic resistivity fluctuations, resulting in variations in the electric characteristics of the final products or devices.

Figure 9:
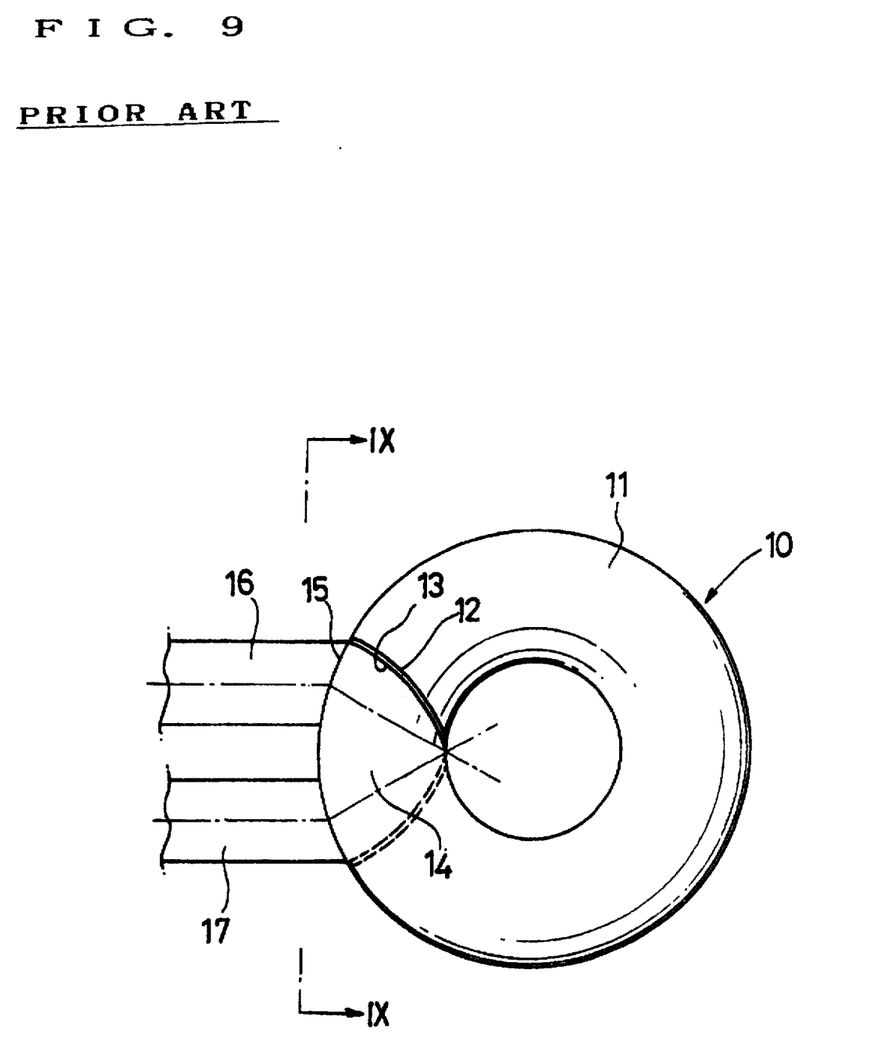
FIG. 9 is a diagrammatical plan view of a high-frequency induction heater according to a second prior art.
Figure 10:
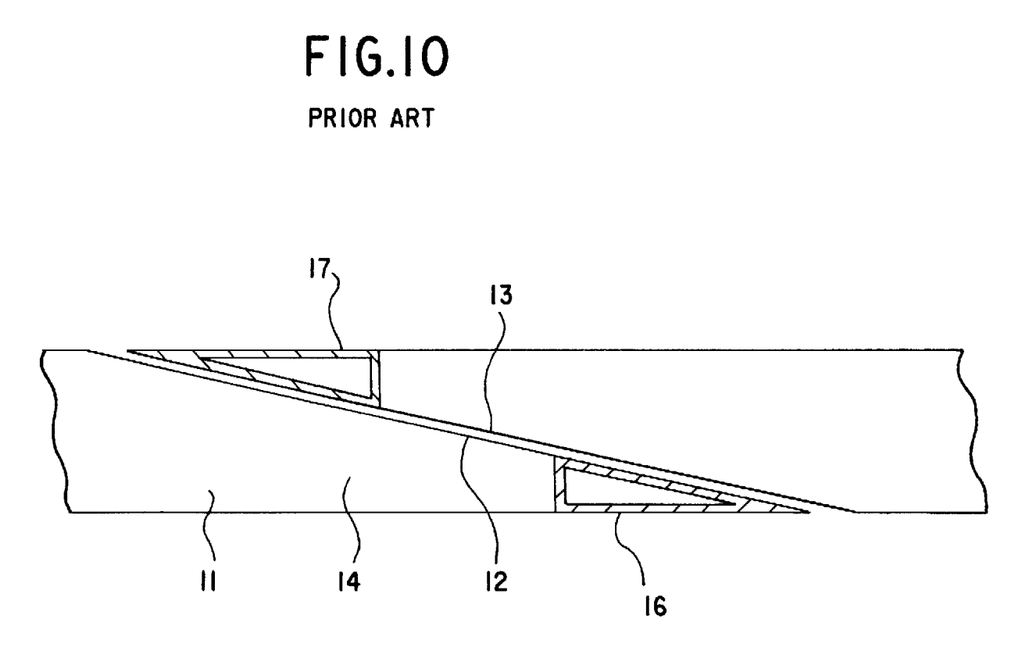
FIG. 10 is a cross-sectional view taken along line X—X of FIG. 9.

To deal with the drawback of the first prior art described above, an improvement has been proposed in which as shown here in FIGS. 9 and 10, a high-frequency induction heater 10 has a single-turn flat heating coil 11 with its opposite ends 12, 13 overlapped in the circumferential direction so as to form an overlapping portion 14, and a pair of power supply terminals 16, 17 disposed on the outer peripheral surface 15 of the heating coil 11 to allow a high-frequency current to flow crosswise at the overlapping portion 14 (Japanese patent Laid-open Publication No. 64-48391 hereinafter referred to as "second prior art").

According to the induction heater 10 of the second prior art, the high-frequency current flows crosswise at the overlapping portion 14, so it is avoidable that a magnetic field is rendered irregular in the vicinity of the opposite ends 12, 13 of the heating coil 11. As a result, the regularity in the magnetic field distribution in the circumferential direction of the heating coil 11 is enhanced.

To meet an increased demand for an FZ-grown semiconductor single crystal 2 having a larger diameter, melting of the float zone 4 shown in FIG. 7 requires concentrated heating at a narrow region. And, the growth of the semiconductor single crystal 2 requires well-balanced gentle heat radiation to avoid temperature gradients produced between the core or center and the periphery of the single crystal 2. These antinomic heating operations cannot be achieved with satisfaction only by the use of a single heating coil.

Figure 11:
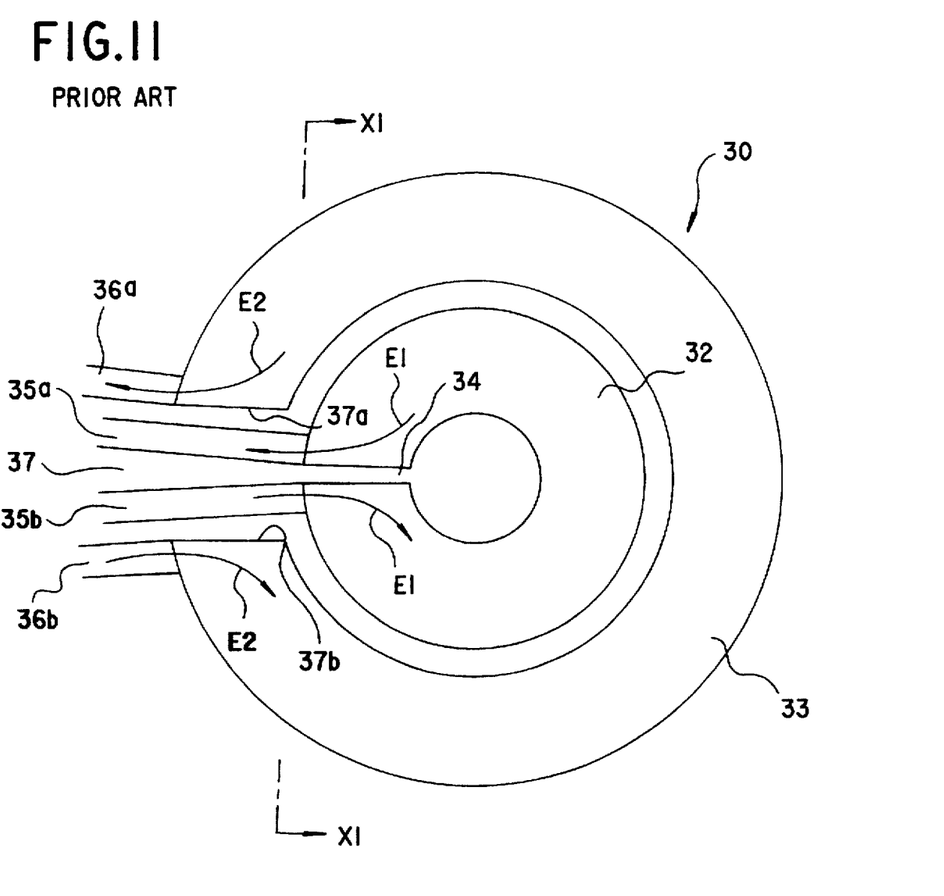
FIG. 11 is a diagrammatical plan view of a high-frequency induction heater according to a third prior art.
Figure 12:
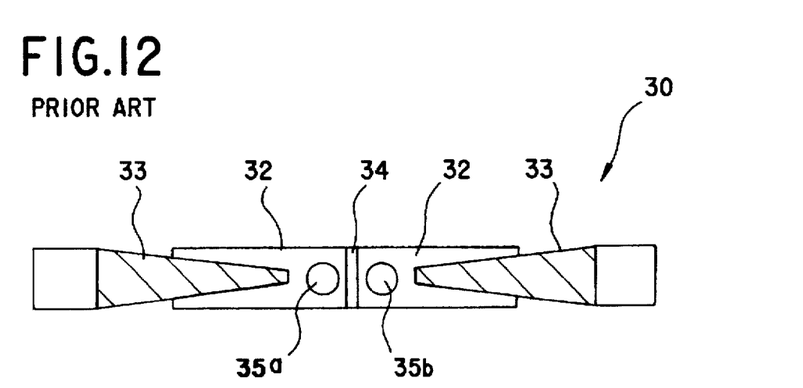
FIG. 12 is a cross-sectional view taken along line XII—XII of FIG. 11.

Under these circumstances, a flat single-turn parallel induction heater 30, such as shown in FIGS. 11 and 12 and hereinafter referred to as "third prior art", has been put into practice. The induction heater 30 includes two flat single-turn induction heating coils 32 and 33 disposed concentrically and parallel with each other. The inner heating coil 32 is composed of a hollow flat body of a substantially wedge-shaped cross section shaped into a ring having a radial air gap 34. Two power supply terminals 35a, 35b are attached to an outer peripheral surface of the inner heating coil 32 at the opposite ends of the latter disposed in confronting relation, with the radial air gap 34 defined therebetween. The power supply terminals 35a, 35b extend radially outwardly to a position adjacent to the outer periphery of the outer heating coil 33. Two power supply terminals 36a, 36b extend radially outwardly from the opposite ends of the outer heating coil 33, respectively.

When the induction heater 30 is used to produce a semiconductor single crystal grown by the FZ method in the manner shown in FIG. 7, the inner heating coil 32 and the outer heating coil 33 can take over a portion of the work.

To be more precise, the inner heating coil 32 is used to melt the polycrystal rod 1 at the float zone 4, and at the same time, the outer heating coil 33 is used to control the speed of heat radiation at the growth zone of the single crystal 2, so that the single crystal growth process can be achieved without generating a temperature difference between the center and the periphery of the single crystal 2.

The use of the induction heater 30 of the third prior art shown in FIGS. 11 and 12 ensures the FZ method a stable growth of a semiconductor single crystal having such a large diameter which has never been realized without difficulties by the use of a single heating coil.

However, according to the arrangement of the induction heater 30 of the third prior art shown in FIGS. 11 and 12, the power supply terminals 35a, 35b provided for supplying a high-frequency current to the inner heating coil 32 extend through a radial air gap 37 defined between two opposed surfaces of the opposite ends of the outer heating coil 33. In other words, the radial air gap 37 of the outer heating coil 33 must have a width large enough to accommodate the power supply terminals 35a, 35b of the inner heating coil 32. In addition, due to a high-frequency current E1 flowing through the power supply terminals 35a, 35b in opposite directions, the magnetic field is extremely intensified at the position of the terminals 35a, 35b. The magnetic field is, therefore, made irregular in distribution at the radial air gap 37 in the outer heating coil 33 with the result that the single crystal as grown necessarily involves the so-called pulsation, i.e., microscopic resistivity fluctuations.

To prevent the pulsation, the induction heater 30 may be so constructed as to provide a nearly axially symmetrical heating pattern. However, since a convection flow caused in the float zone as a result of this heating pattern is also axially symmetrical, the float zone involves a dead melt flow in the vicinity of the center. As a consequence, the resistivity of a single crystal as grown is lower at a central portion than at a peripheral portion. With this resistivity gradient, the macroscopic resistivity distribution in the diametrical direction is degraded.

Even when the convection flow in the float zone is in the axial symmetry, the strength of the convection flow is not always constant throughout the growth process and occasionally changes to cause resistivity fluctuations in the growth direction of the single crystal. In FIG. 11, reference character E2 denotes a high-frequency current flowing through the power supply terminals 36a, 36b of the outer heating coil 33.

SUMMARY OF THE INVENTION

The present invention is conceived with a view to overcoming the drawbacks associated with the FZ single crystal growth method using the parallel induction heater of the third prior art described above.

A more specific object of the present invention is to provide a high-frequency induction heater which is capable of simultaneously improving the microscopic resistivity fluctuations called "pulsation" and the macroscopic resistivity distribution in both the diametrical direction and the growth direction.

Another object of the present invention is to provide a method of producing a semiconductor single crystal using the high-frequency induction heater.

To attain the foregoing objects, a high-frequency induction heater of the present invention is used for the growth of a semiconductor single crystal by the FZ method and includes a plurality of high-frequency induction heating coils disposed in concentric juxtaposed relation to each other and each having a pair of power supply terminals for supplying a high-frequency current to the associated heating coil. The power supply terminals of one of the heating coils are disposed in a space defined between opposite ends of an adjacent heating coil disposed outside the one heating coil. A pair of electrically conductive members is attached to the pair of power supply terminals, respectively, of at least an innermost one of the heating coils so as to cover a space defined between the pair of power supply terminals of the innermost heating coil.

It is preferable that the electrically conductive members each extend from one of the pair of power supply terminals of the innermost heating coil toward the other power supply terminal and have a portion overlapping the portion of the opposite electrically conductive member with a space defined therebetween. The space defined between the overlapping portions is preferably filled in an insulating member.

Preferably, the innermost heating coil has opposite end portions superposed each other with a space defined therebetween so as to form a pair of overlapping coil portions. In an preferred embodiment, the overlapping coil portions are sloped in the circumferential direction of the innermost heating coil.

The overlapping coil portions are composed of a pair of confronting end surfaces, respectively, of said innermost heating coil, the end surfaces being preferably spaced by a distance of 1 to 4 mm. It is further preferable that the space defined between the overlapping coil portions is filled with an insulating member.

Preferably, the power supply terminals of the innermost heating coil are attached to an outer peripheral surface of the innermost heating coil at positions spaced from each other in the winding direction of the innermost heating coil and held out of superposition.

In a preferred embodiment, the number of the plurality of heating coils is two, the two heating coils being composed of an inner heating coil for forming an inner heating zone, and an outer heating coil for forming an outer heating zone, the overlapping coil portions at opposite ends of the inner heating coil overlapping to such an extent that the distribution of heating power generated by said inner heating zone is not perfectly axially symmetrical, and the conductive members of the inner heating coil overlapping to such an extent that the distribution of heating power generated by the outer heating zone is axially symmetrical.

The high-frequency induction heater according to the present invention requires a plurality of high-frequency induction heating coils but has no limitation on the number of the heating coils. In addition to the two heating coils as specifically described above, the present invention may include an arrangement having three or more heating coils.

A method of the present invention for producing a semiconductor single crystal is characterized in that the semiconductor single crystal is produced under the condition that an inner heating zone and an outer heating zone are formed by the use of the high-frequency induction heater specifically described above.

It is preferable that the inner heating zone generates a heating power distribution which is slightly axially asymmetrical to such an extent as to generate an agitating force in a float zone, and the outer heating zone generates a heating power distribution which is axially symmetrical.

Preferably, the semiconductor single crystal is grown at a growth rate of 1.8 to 2.2 mm/min, and the semiconductor single crystal thus grown is subsequently subjected to an after-heating process.

According to the high-frequency induction heater of the present invention, since the distribution of heating power generated by the inner heating zone is slightly off the axial symmetry to such an extent as to generate an agitation force in the float zone, the macroscopic resistivity distribution can be improved. In addition, since the conductive members overlap each other to such an extent that the distribution of heating power generated by the outer heating zone is axially symmetrical, the microscopic resistivity fluctuations can be improved.

The above and other objects, features and advantages of the present invention will become manifest to those versed in the art upon making reference to the detailed description and the accompanying sheets of drawings.

DETAILED DESCRIPTION OF THE INVENTION

One preferred embodiment of the present invention will be described below in greater detail with reference to the accompanying sheets of drawings. It is to be noted that the size, material, shape and relative position of each of the structural components described below with respect to the preferred embodiment should be construed as illustrative rather than restrictive unless as specifically mentioned otherwise.

Figure 1:
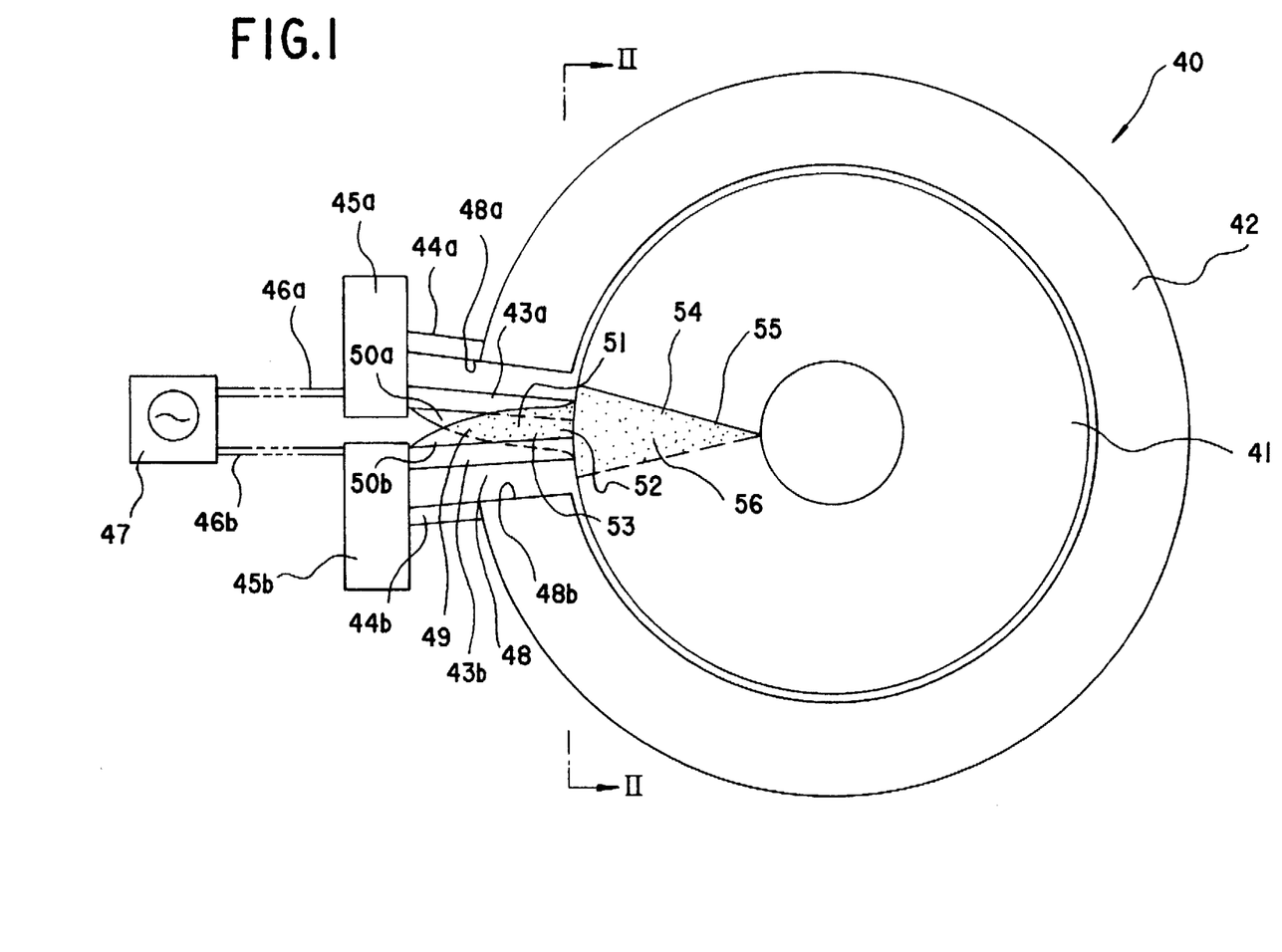
FIG. 1 is a plan view of a high-frequency induction heater according to the present invention.
Figure 2:
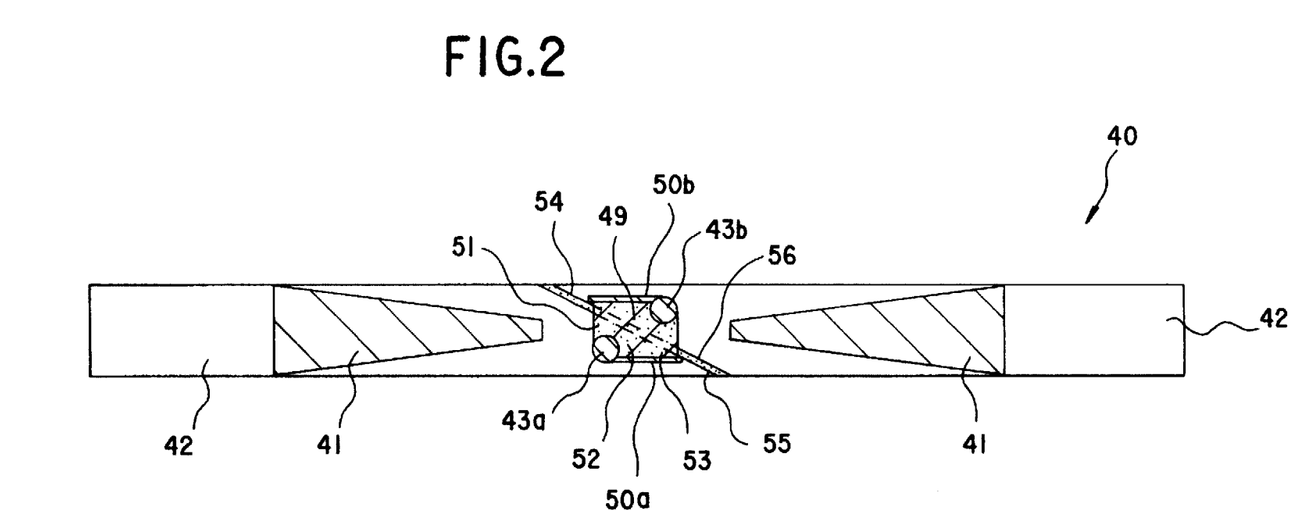
FIG. 2 is an enlarged cross-sectional view taken along line II—II of FIG. 1.

FIG. 1 shows in plan view a high-frequency induction heater 40 according to the present invention embodied in the growth of a semiconductor single crystal by the FZ method. FIG. 2 is an enlarged cross-sectional view taken along line II—II of FIG. 1.

The induction heater 40 includes an inner heating coil 41 and an outer heating coil 42 disposed in concentric, juxtaposed relation with each other. The inner and outer heating coils 41, 42 are made of copper or silver and each have a ring-shaped flat body having a cross section tapering toward an inner peripheral surface of the ring-shaped flat body. A pair of inner power supply terminals 43a and 43b is attached to an outer peripheral surface of the inner heating coil 41 at positions adjacent to the opposite ends, respectively, of the inner heating coil 41. Similarly, a pair of outer power supply terminals 44a and 44b is attached to an outer peripheral surface of the outer heating coil 42 at positions adjacent to the opposite ends, respectively, of the outer heating coil 42. The inner and outer heating coils 41, 42 are connected to a pair of support members 45a, 45b, respectively, via the pairs of power supply terminals 43a, 43b and 44a, 44b.

The support members 45a, 45b are made of copper or silver and connected to a pair of coolant conduits 46a, 46b, respectively, via a pair of openings (not shown) each extending from one surface of each support member 45a, 45b toward the other surface and held in fluid communication with a corresponding one of the inner power supply terminals 43a, 43b and a corresponding one of the outer power supply terminals 44a, 44b that are attached to the other surface of the support member 45a, 45b. A coolant introduced into the coolant conduits 46a, 46b is branched by the openings in the respective support members 45a, 45b and then supplied to the inner and outer power supply terminals 43a, 43b and 44a, 44b.

The coolant conduits 46a, 46b are connected to a high-frequency power supply 47 at one end remote from the support members 45a, 45b, so that a high-frequency current from the power supply 47 is supplied at the same frequency to the heating coils 41, 42 successively through the coolant conduits 46a, 46b, the support members 45a, 45b and the power supply terminals 43a, 43b and 44a, 44b.

The power supply terminals 43a, 43b for supplying the high-frequency current therethrough to the inner heating coil 41 are disposed in a space 48 defined between two confronting surfaces 48a, 48b at the opposite ends of the outer heating coil 42. The power supply terminals 43a, 43b are attached to the outer peripheral surface of the inner heating coil 41 at positions which are located adjacent to the opposite ends of the inner heating coil 41 and spaced from each other in the circumferential direction of the inner heating coil 41 so that the power supply terminals 43a, 43b are held out of complete superposition. A pair of vertically confronting electrically conductive members 50a and 50b is attached to the power supply terminals 43a, 43b, respectively, so as to cover a space 49 defined between the power supply terminals 43a, 43b.

The conductive members 50a, 50b each extend contiguously from a corresponding one of the power supply terminals 43a, 43b toward the opposite power supply terminal. Each of the conductive members 50a, 50b has a proximal end portion connected to the inner heating coil 41 to which the associated power supply terminal 43a, 43b is attached. The conductive members 50a, 50b are disposed in vertical confrontation and hence have respective portions overlapping each other and defining therebetween a space 52 in which an insulating member 53 composed of a quartz plate is filled to prevent an electric discharge.

Since the conductive members 50a, 50b are attached to the pair of power supply terminals 43a, 43b in a non-contacting overlapping relation to each other, portions of the high-frequency current flowing in the power supply terminals 43a, 43b in opposite directions tend to attract each other by the proximity effect with the result that the current is distributed over the associated conductive member 50a, 50b. As a consequence of this current distribution, the intensity of a magnetic field at a position between the power supply terminals 43a, 43b and the resulting temperature in the vicinity of the power supply terminals 43a, 43b drop as compared to the intensity of a magnetic field and the resulting temperature generated when the conductive members 50a, 50b are absent or omitted. Thus, an outer heating zone formed jointly by the outer heating coil 42 and the power supply terminals 43a, 43b incorporating the conductive members 50a, 50b can generate a heating power distribution which is axially symmetrical, as indicated by the dot-and-dash line denoted by "b" in FIG. 3.

The opposite ends of the inner heating coil 41 are sloped in the circumferential direction and superpose each other without contact so as to jointly form a pair of overlapping portions 54 spaced from one another by a properly adjusted distance in the range of 1–4 mm. The space 55 between the overlapping coil portions 54 is filled with an insulating member 56 composed of a quartz plate to prevent an electric discharge.

With the coil ends thus arranged, a high-frequency current supplied from the power supply terminals 43a, 43b to the inner heating coil 41 tend to attract by itself as it flows in the overlapped coil portions 54. As a result, generation of a non-uniform magnetic field can be avoided. However, if portions of the high-frequency current flowing in the overlapping coil portions 54 fully intersect each other for enabling the inner heating coil 41 to generate a heating power distribution which is perfectly axially symmetrical, the agitation force directed toward the center of the float zone is balanced in all directions and hence can only exert a very weak effect on the float zone. Thus, the macroscopic resistivity distribution is deteriorated. To avoid the occurrence of this deficiency, the power supply terminals 43a, 43b, which are attached to the outer peripheral surface of the inner heating coil 41 at positions adjacent to opposite ends of the inner heating coil 41, are spaced in the winding direction of the coil and hence held out of perfect superposition.

Figure 3:
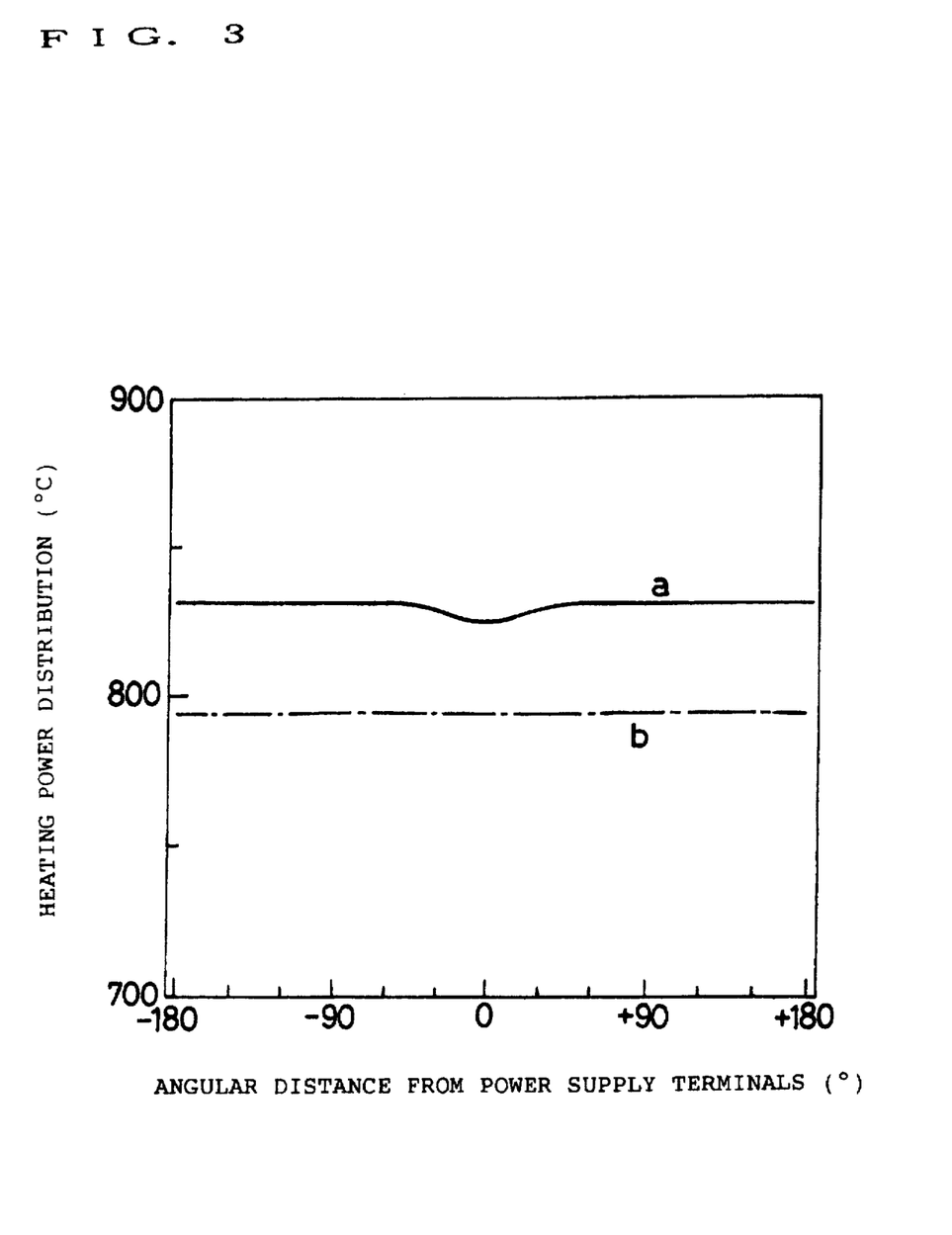
FIG. 3 is a graph showing one example of the heating power distribution attained by the high-frequency induction heater of the present invention.

Since portions of the high-frequency current flowing in the overlapping coil portions 54 do never intersect each other, the distribution of heating power generated by the inner heating zone formed by the inner heating coil 41 is partly non-uniform and not fully axially symmetrical, as indicated by the solid line denoted by "a" in FIG. 3.

According to the induction heater 40 of the present invention, since the distribution of heating power generated by the inner heating zone is slightly off the axial symmetry to such an extent as to generate an agitation force in the float zone, the macroscopic resistivity distribution can be improved. In addition, since the conductive members 50a, 50b overlap each other to such an extent that the distribution of heating power generated by the outer heating zone is axially symmetrical, the microscopic resistivity fluctuations can be improved.

The present invention will be further described below by way of the following experimental example in which a silicon single crystal is grown by the FZ method with the use of the induction heater 40 of the present invention.

EXAMPLE 1

Using the induction heater 40 shown in FIG. 1, an n-type <111> silicon single crystal of 100 mm in diameter was grown at a growth rate of 2.5 mm/min and at a crystal rotation rate of 5 rpm while a polysilicon rod of 100 mm in diameter was continuously supplied at a rotation rate of 0.5 rpm.

A body of the silicon single crystal thus grown was sliced into silicon substrates or wafers from which ten silicon substrates were sampled at equal intervals in the direction from the seed crystal side to the tail end side of the silicon single crystal. The sampled ten silicon substrates were each measured for resistivity by the four point probe method taken at respective points spaced at 10 mm in the diametrical direction. From the measured values or measurements the averaged value of all measuring points was calculated.

Figure 4:
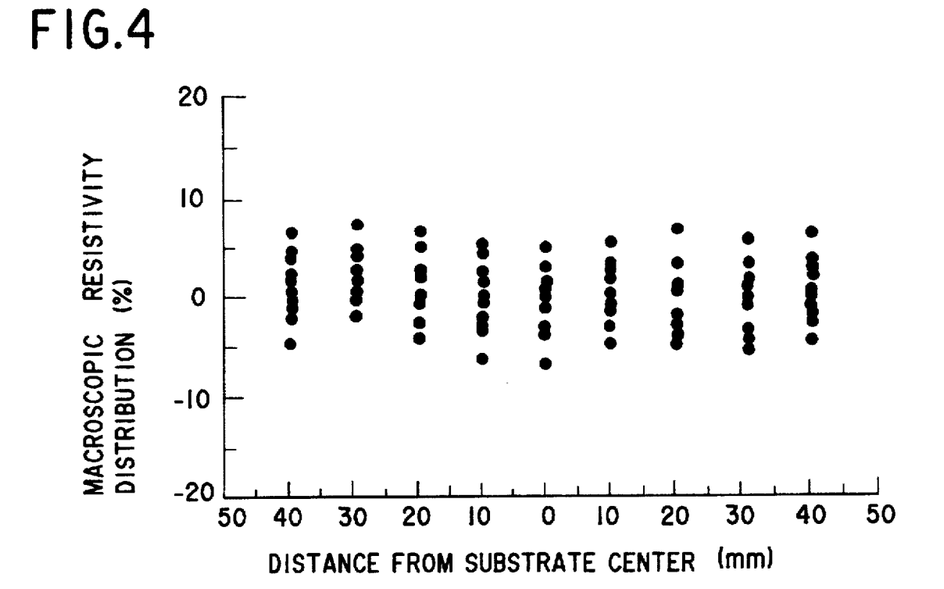
FIG. 4 is a graphical representation of a series of overlapped resistivity distributions in the diametrical direction measured by the four point probe method for a plurality of substrates sliced from a silicon single crystal of Example 1.

Then, using the following formula (1), the distribution of resistivity at each measuring point was calculated for the ten sample silicon substrates, and the calculated values were plotted on FIG. 4 as indicating the macroscopic resistivity distribution in FIG. 4:

$$\frac{\text{Each measured value} - \text{Averaged value}}{\text{Averaged value}} \times 100 \quad (1)$$

Figure 5:
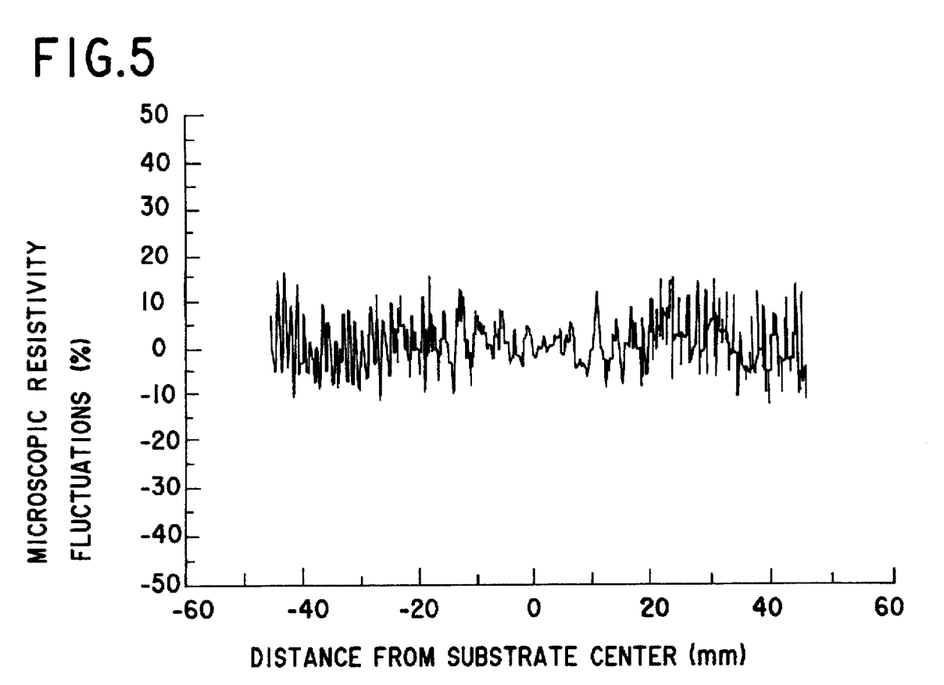
FIG. 5 is a graphical representation of resistivity fluctuations in the diametrical direction measured by the SR (Spreading Resistance) method for the silicon single crystal of Example 1.

On the other hand, one of the sample silicon substrates was measured by the SR (Spreading Resistance) method taken in the diametrical direction and the measured values or measurements were output after calculation using the following formula (2):

$$\frac{\text{Each measured value} - \text{Averaged value}}{\text{Averaged value}} \times 100 \quad (2)$$

The output data is indicated as microscopic resistivity fluctuations in FIG. 5.

COMPARATIVE EXAMPLE 1

Using the conventional single-turn parallel induction heater 30 shown in FIGS. 11 and 12, a silicon single crystal was grown under the same condition as Example 1. Then, ten sliced silicon substrates were sampled from the silicon single crystal and after that macroscopic resistivity distribution and microscopic resistivity fluctuations were obtained in the same manner as done in Example 1. The thus obtained resistivity distribution and resistivity fluctuations are shown in FIGS. 13 and 14, respectively.

Figure 13:
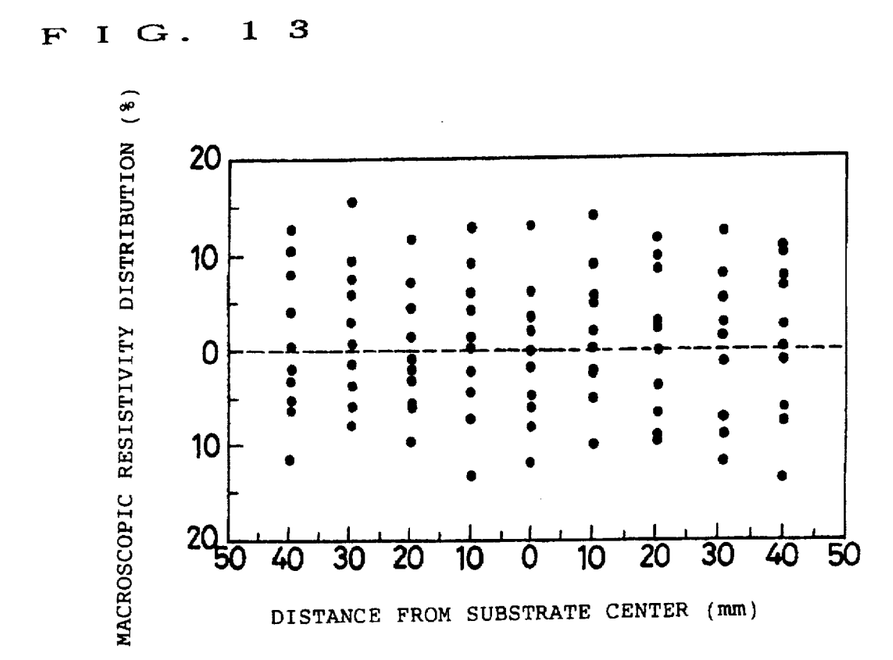
FIG. 13 is a graphical representation of a series of overlapped resistivity distributions in the diametrical direction measured by the four point probe method for a plurality of substrates sliced from a silicon single crystal of Comparative Example 1.
Figure 14:
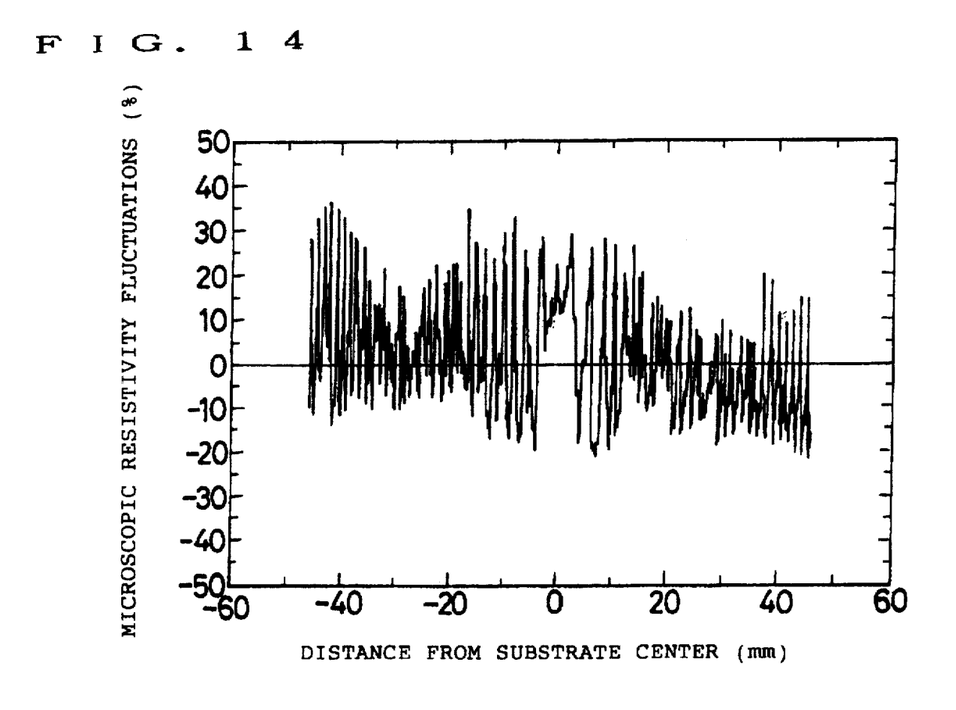
FIG. 14 is a graphical representation of resistivity fluctuations in the diametrical direction measured by the SR method for the silicon single crystal of Comparative Example 1.

A study of FIGS. 4 and 5 taken in comparison with FIGS. 13 and 14 clearly indicates that the induction heater according to the present invention can improve the macroscopic resistivity distribution and the microscopic resistivity fluctuations to a great extent as compared to the conventional induction heater.

Although the embodiment shown in FIG. 1 employs two heating coils composed of an inner heating coil 41 and an outer heating coil 42, the induction heater 40 of this invention may include three or more heating coils disposed in concentric juxtaposed relation to one another.

In this instance, the foregoing description can be also applied to a plurality of inner heating coils and a plurality of outer heating coils.

A method of producing a semiconductor single crystal according to the present invention will be described below as Example 2 with reference to FIGS. 1 and 6.

EXAMPLE 2

In the method of this invention for growing a semiconductor single crystal by the FZ method, the high-frequency induction heater 40 was used and an n-type <111> 100 mm diameter silicon single crystal 62 was grown at a growth rate of 1.8–2.2 mm/min and at a crystal rotation rate of 7 rpm while supplying a 100 mm diameter polysilicon rod 61 at a rotation rate of 0.4 rpm. The growth rate employed was slightly lower than that used in Example 1 for the purpose of improving the microscopic resistivity fluctuations in the diametrical direction with increased reliability.

Figure 6:
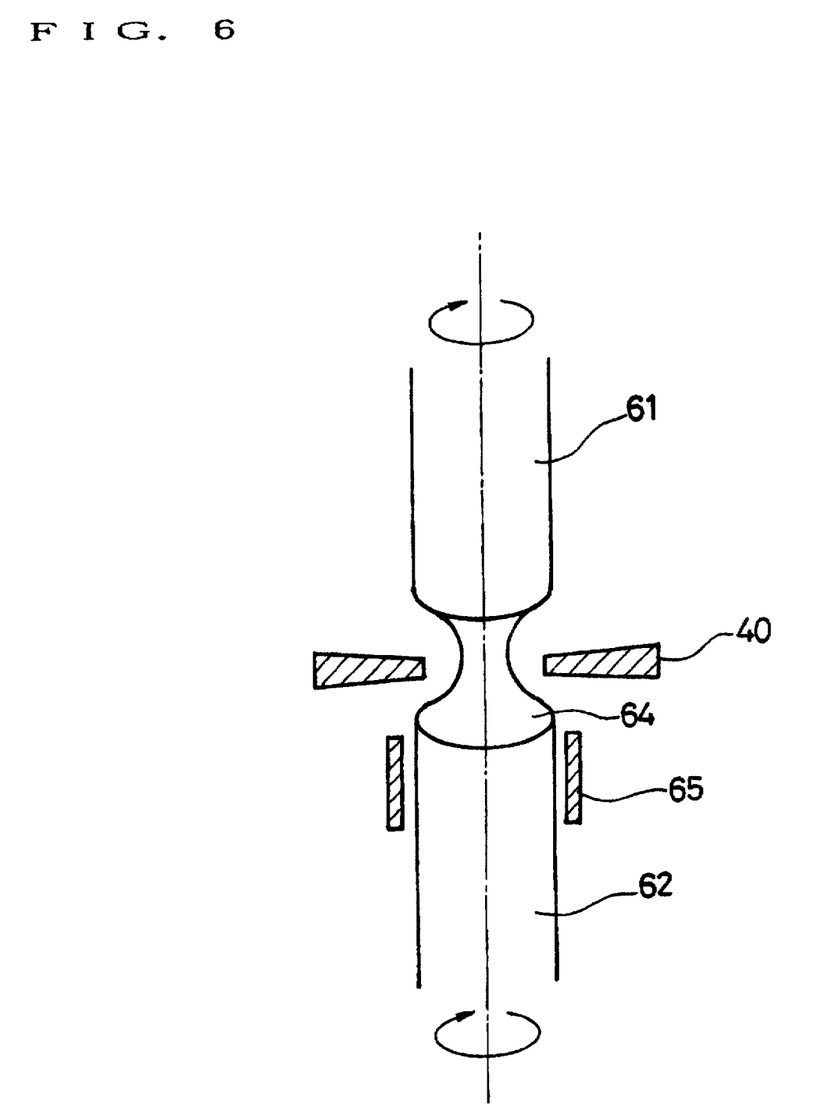
FIG. 6 is a diagrammatical explanatory view showing a method of growing a single crystal by the FZ method according to the present invention.

The silicon single crystal 62 was subjected to an after-heating process using a 135 mm diameter, 40 mm width tubular reflecting plate or reflector 65 disposed at a position 33 mm above the bottom of the high-frequency induction heater 40, so as to surround the silicon single crystal 62, as shown in FIG. 6. By the effect of this after-heating, the temperature gradient of the growing silicon single crystal 62 could be gentled with the result that microscopic fluctuations of the growth rate could be reduced. In FIG. 6, numeral 64 denotes a float zone. In this Example 2, it was confirmed that the macroscopic resistivity distribution and microscopic resistivity fluctuations of the silicon single crystal could be greatly improved.

As described above, by using the high-frequency induction heater of this invention, the so-called "pulsation", i.e., microscopic resistivity fluctuations in a semiconductor single crystal and the macroscopic resistivity distribution in the diametrical and growth directions of the semiconductor single crystal can be improved at the same time.

Obviously, various minor changes and modifications of the present invention are possible in the light of the above teaching. It is therefore to be understood that within the scope of appended claims the invention may be practiced otherwise than as specifically described.

What is claimed is:

1. A high-frequency induction heater for use in the growth of a semiconductor single crystal by the FZ method comprising:

at least inner and outer high-frequency induction heating coils disposed in concentric juxtaposed relation to each other, and each coil has a pair of power supply terminals for supplying a high-frequency current to the associated heating coil, said pair of power supply terminals of the inner heating coil being disposed in a space defined between opposite ends of the outer heating coil; and a pair of electrically conductive members attached to the pair of power supply terminals, respectively, of at least said inner heating coil so as to cover a space defined between said pair of power supply terminals of said inner heating coil.

2. A high-frequency induction heater according to claim 1, wherein said electrically conductive members each extend from one of said pair of power supply terminals of said inner heating coil toward the other power supply terminal and have a portion overlapping the portion of the opposite electrically conductive member with a space defined therebetween.

3. A high-frequency induction heater according to claim 2, wherein said space defined between said overlapping portions of the respective electrically conductive members is filled in an insulating member.

4. A high-frequency induction heater according to claim 1, wherein said inner heating coil has opposite end portions superposed each other with a space defined therebetween so as to form a pair of overlapping coil portions.

5. A high-frequency induction heater according to claim 4, wherein said overlapping coil portions are sloped in the circumferential direction of said inner heating coil.

6. A high-frequency induction heater according to claim 4, wherein said overlapping coil portions have a pair of confronting end surfaces, respectively, of said inner heating coil, said end surfaces being spaced by a distance of 1 to 4 mm.

7. A high-frequency induction heater according to claim 4, wherein said space defined between said overlapping coil portions is filled with an insulating member.

8. A high-frequency induction heater according to claim 4, wherein said power supply terminals of said inner heating coil are attached to an outer peripheral surface of said inner heating coil at positions spaced from each other in the winding direction of said inner heating coil and held out of superposition.

9. A high-frequency induction heater according to claim 4, wherein the inner heating coil for forming an inner heating zone, and the outer heating coil for forming an outer heating zone, said overlapping coil portions at opposite ends of said inner heating coil overlapping to such an extent that the distribution of heating power generated by said inner heating zone is not perfectly axially symmetrical, and said conductive members of said inner heating coil overlapping to such an extent that the distribution of heating power generated by said outer heating zone is axially symmetrical.

10. A method of producing a semiconductor single crystal, characterized in that the semiconductor single crystal is produced under the condition that an inner heating zone and an outer heating zone are formed by the use of the high-frequency induction heater of claim 1.

11. A method of producing a semiconductor single crystal, characterized in that the semiconductor single crystal is produced under the condition that an inner heating zone and an outer heating zone are formed by the use of the high-frequency induction heater of claim 4.

12. A method according to claim 10, wherein said inner heating zone generates a heating power distribution which is slightly axially asymmetrical to such an extent as to generate an agitating force in a float zone, and said outer heating zone generates a heating power distribution which is axially symmetrical.

13. A method according to claim 11, wherein said inner heating zone generates a heating power distribution which is slightly axially asymmetrical to such an extent as to generate an agitating force in a float zone, and said outer heating zone generates a heating power distribution which is axially symmetrical.

14. A method according to claim 10, wherein the semiconductor single crystal is grown at a growth rate of 1.8 to 2.2 mm/min.

15. A method according to claim 11, wherein the semiconductor single crystal is grown at a growth rate of 1.8 to 2.2 mm/min.

16. A method according to claim 10, wherein the semiconductor single crystal is subsequently subjected to an after-heating process.

17. A method according to claim 11, wherein the semiconductor single crystal is subsequently subjected to an after-heating process.

* * * * *